US010342139B2

(12) United States Patent
Zhang (10) Patent No.: US 10,342,139 B2
(45) Date of Patent: Jul. 2, 2019

(54) PRINTER AND PRINTING METHOD FOR PRINTING OF PRINTED CIRCUIT BOARDS

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Xue-Qin Zhang, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 4 days.

(21) Appl. No.: 14/961,201

(22) Filed: Dec. 7, 2015

(65) Prior Publication Data

US 2017/0142843 A1 May 18, 2017

(30) Foreign Application Priority Data

Nov. 13, 2015 (CN) .......................... 2015 1 0774758

(51) Int. Cl.
| H05K 3/22 | (2006.01) |
| G05B 19/4099 | (2006.01) |
| H05K 3/00 | (2006.01) |
| H05K 3/46 | (2006.01) |
| H05K 3/12 | (2006.01) |

(52) U.S. Cl.
CPC .......... *H05K 3/22* (2013.01); *G05B 19/4099* (2013.01); *H05K 3/0085* (2013.01); *H05K 3/0091* (2013.01); *H05K 3/0097* (2013.01); *H05K 3/1241* (2013.01); *H05K 3/1275* (2013.01); *H05K 3/4644* (2013.01); *G05B 2219/49023* (2013.01); *H05K 3/005* (2013.01); *H05K 3/125* (2013.01); *H05K 3/4611* (2013.01)

(58) Field of Classification Search
CPC .. H05K 3/1275; H05K 3/4644; H05K 3/0085; H05K 3/0091; H05K 3/0097; H05K 3/22; H05K 3/125; H05K 3/1241
See application file for complete search history.

(56) References Cited

U.S. PATENT DOCUMENTS 2,914,996 A * 12/1959 Whitham ............... G03G 15/22
399/130
3,532,893 A * 10/1970 Marantette ............. B23Q 35/02
408/3
(Continued)

FOREIGN PATENT DOCUMENTS

| CN | 101600299 A | 12/2009 |
| CN | 101977484 A | 2/2011 |
(Continued)

*Primary Examiner* — Timothy Kennedy
(74) *Attorney, Agent, or Firm* — ScienBiziP, P.C.

(57) ABSTRACT

A printer includes a belt, a tray and a plurality of printing devices located over the belt. The tray is located on the belt and receives a printed circuit board (PCB). A sensor attached to the tray. The sensor is used to sense whether the PCB is located in the tray, when the PCB is located in the tray, the belt is driven by a driving device to transport the tray to be located below each of the plurality of printing devices. Each of the plurality of printing devices is used to print the PCB. The disclosure further offers a printing method for the PCB using the printer.

11 Claims, 8 Drawing Sheets

(56) References Cited

U.S. PATENT DOCUMENTS

| | | | | |
|---|---|---|---|---|
| 4,305,975 A * | 12/1981 | Ikari | H05K 3/181 | 216/13 |
| 4,539,069 A * | 9/1985 | Fishman | H05K 3/0085 | 118/314 |
| 4,554,732 A * | 11/1985 | Sadlo | H01C 13/02 | 29/620 |
| 5,211,756 A * | 5/1993 | Grubelic | B05B 13/0221 | 118/316 |
| 5,230,685 A * | 7/1993 | Christen | B23B 39/161 | 408/43 |
| 5,238,175 A * | 8/1993 | Hughey | B23K 1/085 | 228/180.1 |
| 5,343,802 A * | 9/1994 | Shimada | B41F 15/0813 | 101/123 |
| 5,374,331 A * | 12/1994 | Costello | B23K 1/206 | 216/106 |
| 5,462,599 A * | 10/1995 | Kuster | H05K 3/0091 | 118/314 |
| 5,494,529 A * | 2/1996 | Ciccarelli | B08B 3/022 | 134/15 |
| 5,637,148 A * | 6/1997 | Kuster | B05C 13/02 | 118/314 |
| 5,637,426 A * | 6/1997 | Uchikawa | H05K 3/0082 | 347/106 |
| 5,692,292 A * | 12/1997 | Asai | H05K 13/0061 | 198/341.04 |
| 5,693,375 A * | 12/1997 | Sato | B41C 1/105 | 427/128 |
| 5,711,806 A * | 1/1998 | Harnden | H05K 3/0085 | 118/407 |
| 5,716,663 A * | 2/1998 | Capote | B23K 35/0222 | 156/277 |
| 5,838,567 A * | 11/1998 | Boggio, Jr. | H05K 3/00 | 700/121 |
| 5,863,620 A * | 1/1999 | Schafer | G03F 7/16 | 118/202 |
| 6,183,190 B1 * | 2/2001 | Raiteri | B23Q 7/00 | 269/54.5 |
| 6,575,351 B1 * | 6/2003 | Kobayashi | B23K 3/0623 | 228/207 |
| 6,754,551 B1 * | 6/2004 | Zohar | B41J 2/01 | 228/43 |
| 7,252,100 B1 * | 8/2007 | Downes | H05K 3/26 | 134/103.2 |
| 7,552,529 B2 * | 6/2009 | Konrath | H05K 13/0061 | 198/341.02 |
| 8,678,534 B2 * | 3/2014 | Rozenstein | B41J 2/2139 | 347/14 |
| 2002/0146294 A1 * | 10/2002 | Martinez | B23Q 1/012 | 408/1 R |
| 2003/0027363 A1 * | 2/2003 | Kodama | G05B 19/4065 | 438/14 |
| 2003/0051617 A1 * | 3/2003 | Murakami | H05K 3/0097 | 101/228 |
| 2003/0177639 A1 * | 9/2003 | Berg | H05K 3/0079 | 29/847 |
| 2005/0000414 A1 * | 1/2005 | Culik | H01L 31/022425 | 118/200 |
| 2005/0241506 A1 * | 11/2005 | Walther | G06K 19/07749 | 101/232 |
| 2006/0001866 A1 * | 1/2006 | Clarke | G01N 21/95684 | 356/300 |
| 2006/0055722 A1 * | 3/2006 | Hirai | B41J 29/393 | 347/19 |
| 2007/0020053 A1 * | 1/2007 | Furukawa | B23B 35/00 | 408/1 R |
| 2007/0141263 A1 * | 6/2007 | Schaefer | B05C 1/025 | 427/355 |
| 2007/0263862 A1 * | 11/2007 | Tseng | H05K 1/0269 | 380/51 |
| 2011/0155424 A1 * | 6/2011 | Noy | G06F 17/5068 | 174/250 |
| 2011/0297020 A1 * | 12/2011 | Tanaka | B41F 15/0881 | 101/126 |
| 2011/0315433 A1 * | 12/2011 | Thumser | H05K 3/0097 | 174/255 |
| 2012/0045852 A1 * | 2/2012 | Baccini | B41F 15/0818 | 438/14 |
| 2012/0216690 A1 * | 8/2012 | Tomomatsu | B41F 15/0881 | 101/123 |
| 2014/0073088 A1 * | 3/2014 | Maeda | H05K 13/0465 | 438/107 |
| 2015/0136837 A1 * | 5/2015 | Maeda | H05K 13/08 | 228/102 |
| 2015/0223344 A1 * | 8/2015 | Lazaro Gallego | H05K 3/0097 | 219/617 |
| 2016/0052830 A1 * | 2/2016 | Oi | H01L 21/677 | 228/103 |

FOREIGN PATENT DOCUMENTS

| | | |
|---|---|---|
| CN | 203666137 U | 6/2014 |
| CN | 104936386 A | 9/2015 |
| CN | 105044336 A | 11/2015 |
| JP | 2005-88390 A | 4/2005 |

* cited by examiner

PRINTER AND PRINTING METHOD FOR PRINTING OF PRINTED CIRCUIT BOARDS

FIELD

The subject matter herein generally relates to printers, and particularly, to a printer capable of printing a printed circuit board (PCB) and a related method.

BACKGROUND

Three-dimensional (3D) printing is a process of making a three-dimensional solid object based on a digital model. For example, an additive process is used, in which successive layers of plastic material are laid down. PCBs are widely used in electronic devices, such as computers, servers, and mobile communication devices, for example. PCBs provide a mechanism for implementing a circuit design (i.e., the interconnection of the electrical devices and components) for use, for example, in a computer system. In general, a PCB can be single-sided or double-sided boards.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

The present disclosure is described in relation to a printer. The printer includes a belt, a tray and a plurality of processing devices located over the belt. The tray is located on the belt and receives a printed circuit board (PCB). A sensor is attached to the tray. The sensor is used to sense whether the PCB is located in the tray, when the PCB is located in the tray, the belt is driven by a driving device to transport the tray to be located below each of the plurality of devices. The disclosure further offers a printing method for the PCB using the printer.

Figure 1:
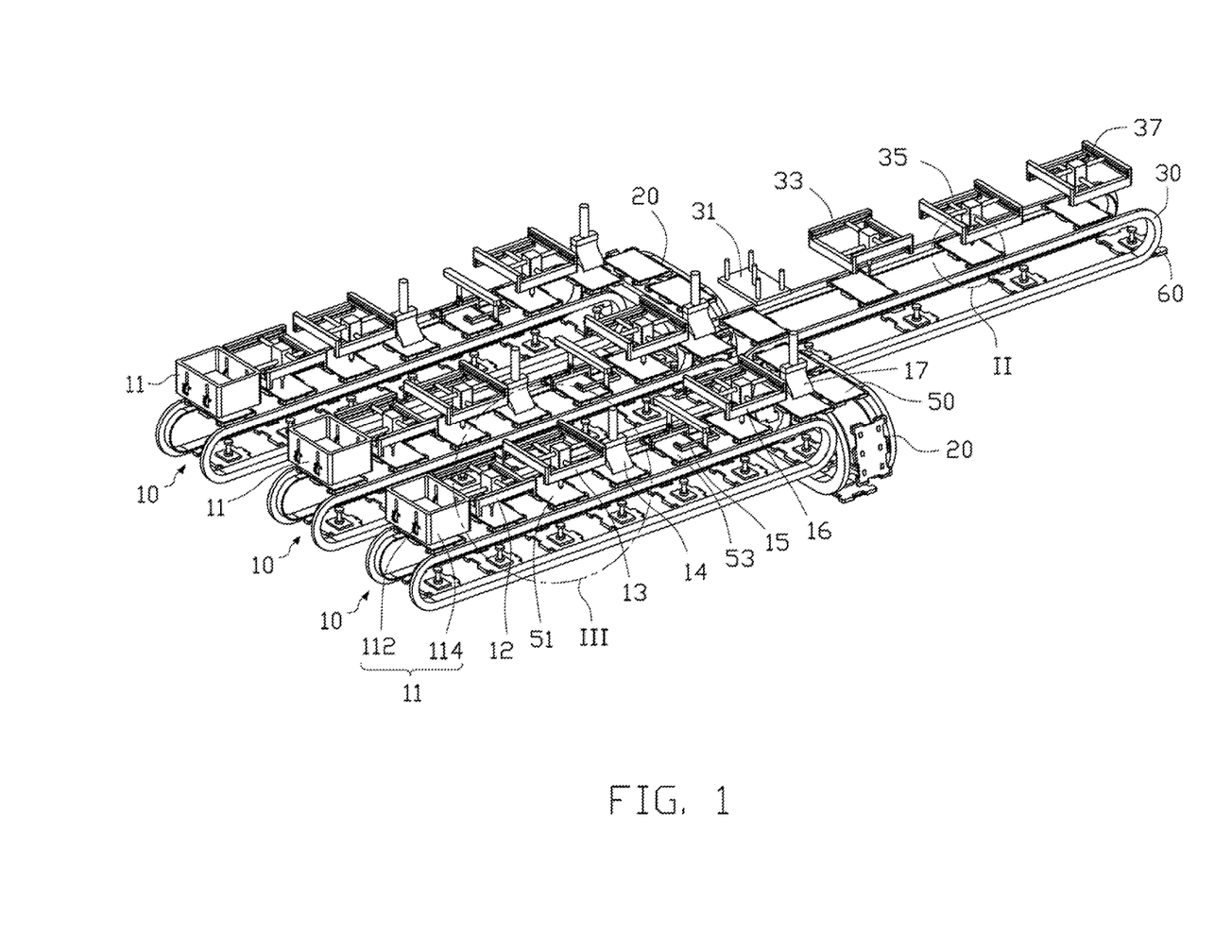
FIG. 1 is an isometric view of an example embodiment of a printer.
Figure 2:
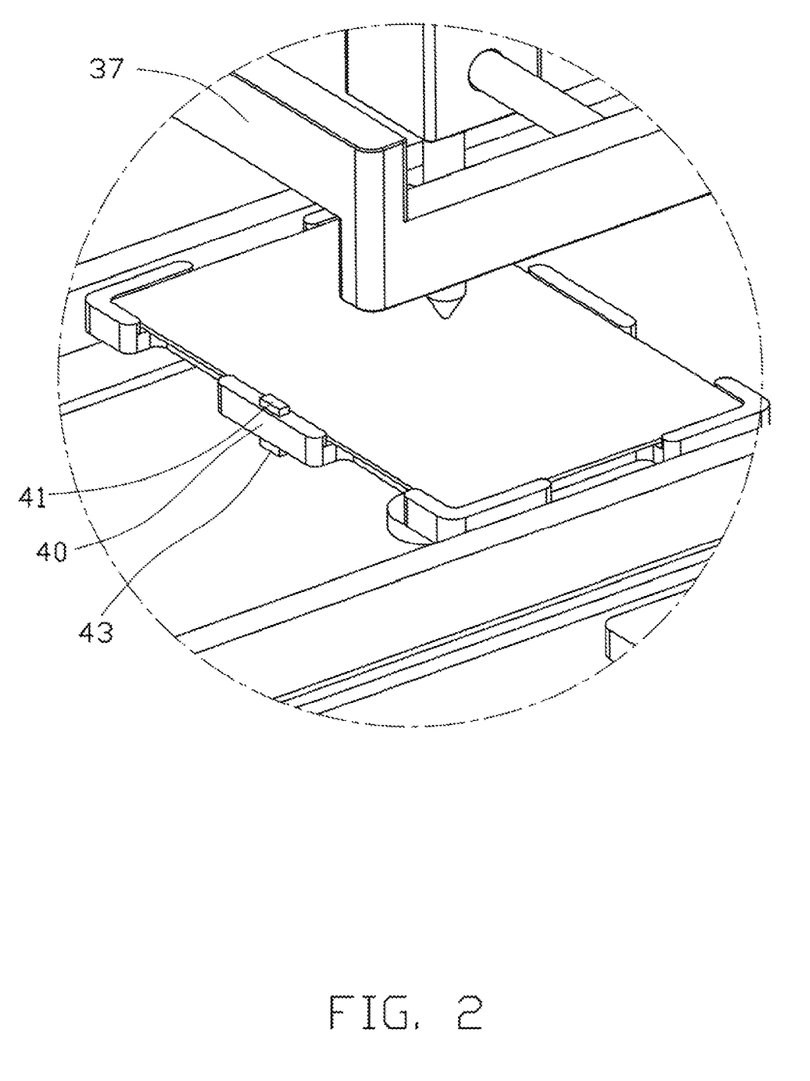
FIG. 2 is an enlarged view of a circle portion II of the printer of FIG. 1.

FIGS. 1-2 illustrate an embodiment of a printer 100 including at last one first belt 10, at least one second belt 20, and a third belt 30. In at least one embodiment, the first belt 10 can comprise three first belts arranged at in a first line, and the second belt 20 can comprise three second belts 20 arranged in a second line.

A plurality of trays 40 can be secured on each first belt 10, each second belt 20, and the third belt 30. Each tray 40 can be moveable to catch a printed circuit board (PCB) 50. A first sensor 41 and a second sensor 43 are located on each tray 40 (see FIG. 2). The first sensor 41 is configured to sense whether the PCB 50 is located in the tray 40. Before the PCB 50 drops into the tray 40, arms 45 of the tray 40 extend outwardly. When the first sensor 41 senses the PCB 50 is located in the tray 40, the arms 45 extend inwardly to hold the PCB 50. The second sensor 43 is configured to sense a location where the tray 40 is located. That is, when the tray 40 is sent to a predetermined location, the second sensor 43 can send a signal to a driving device (not shown) for allowing the driving device to stop the at least one first belt 10, the at least one second belt 20, or the third belt 30, thereby the PCB 50 in the tray 40 can be printed by the printer 100. In at least one embodiment, the driving device can be a stepper motor.

In at least one embodiment, the plurality of devices can include a feeding device 11, a punching device 12, a first line printing device 13, a first brush 14, a flipping device 15, a second line printing device 16, or a second brush 17. In at least one embodiment, the feeding device 11, the punching device 12, the first line printing device 13, the first brush 14, the flipping device 15, the second line printing device 16, and the second brush 17 are arranged on each first belt 10.

The feeding device 11 can include a feeding box 112 and a plurality of gears 114 located on the feeding box 112. A depth of a tooth of each gear 114 can be adjustable according to a thickness of the PCB 50. In at least one embodiment, the plurality of gears 114 can include four gears 114, wherein a first pair of gears 114 is located on a first side of the feeding box 112, and a second pair of gears 114 is located on a second opposite side of the feeding box 112. In at least one embodiment, the first pair of gears 114 is coupled by a first axel, and two first guide rails are coupled to opposite ends of the first axel. The second pair of gears 114 is coupled by a second axel, and two second guide rails are coupled to opposite ends of the second axel. The first guide rail is a same length as the second guide rails, and first guide rails are a same width as the second guide rails. Therefore, the location of the plurality of gears 114 can be guided by the first and second guide rails. In at least one embodiment, the rotating direction of each gear 114 is the same, when each gear 114 is rotated, the PCB 50 caught by the four gears 114 can drop into the tray 40 below the feeding box 112, and a next PCB 50 to be caught by the four gears 114 is in queue.

Figure 3:
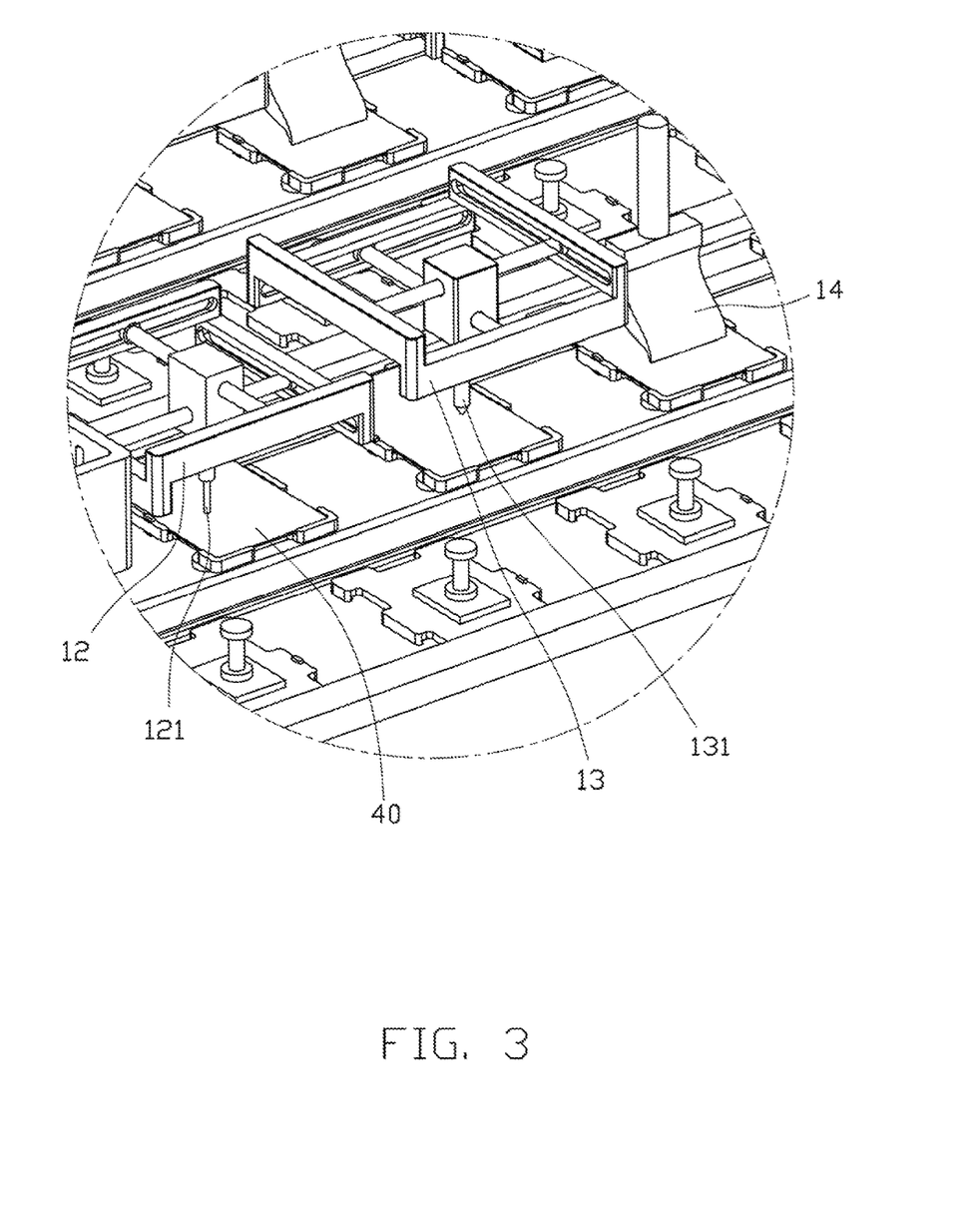
FIG. 3 is an enlarged view of a circle portion III of the printer of FIG. 1.

FIG. 3 illustrates the punching device 12 on the printer 100. The punching device 12 is configured to punch the PCB 50. In at least one embodiment, a plug hole, or a blind hole can be punched by the punching device 12. The punching device 12 can include a punching head 121. The punching head 121 can be moved in an X axis and a Y axis (not shown).

FIG. 1 illustrates that the first line printing device 13 is configured to print a line on a top layer 51 of the PCB 50. In at least one embodiment, a conductive adhesive or conductive ink can be used in the first line printing device 13. The conductive adhesive is composed of resin matrix, conductive particles, dispersing additives, additives, etc. The conductive ink is dissolved in a solvent containing polymer latex, with a diameter of less than 0.1 micron. Therefore, according to the viscosity of the conductive adhesive or conductive ink, the air pressure of the printing head 131 is changed, and the thickness of line on the PCB 50 can be adjusted.

The first brush 14 is configured to brush insulating adhesive on the top layer 51. In at least one embodiment, if the PCB 50 is a signal-board, the first brush 14 cannot be used.

Figure 4:
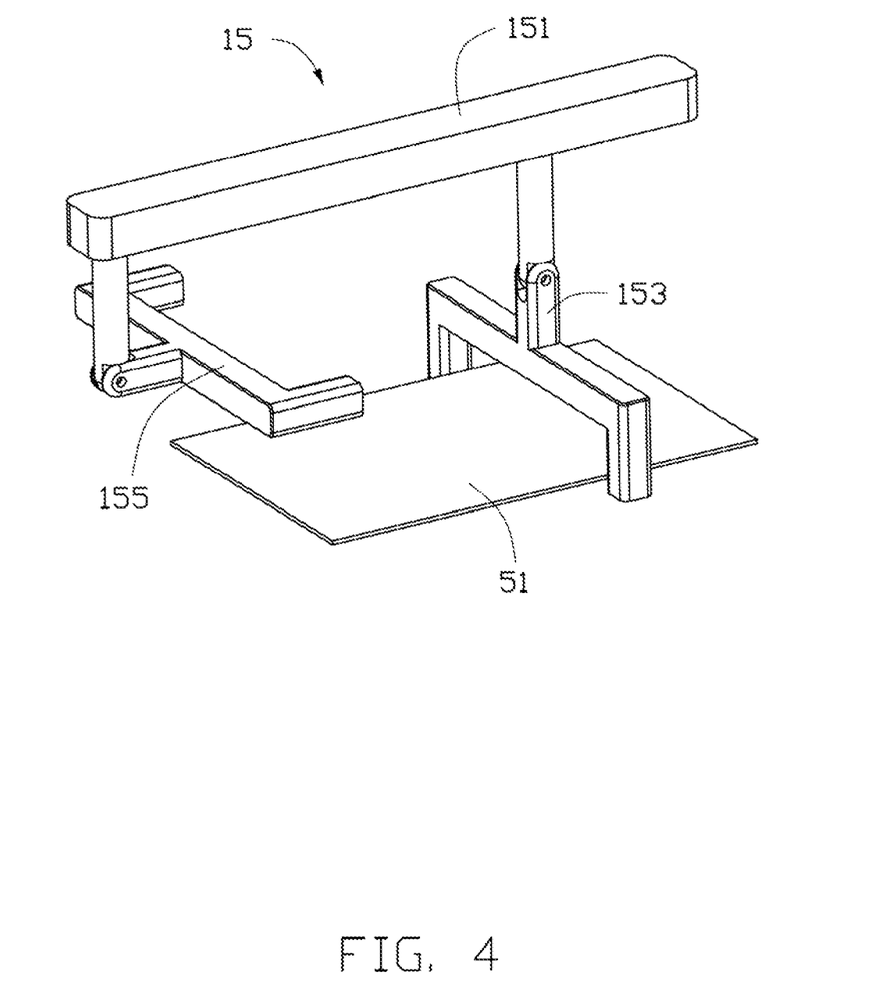
FIG. 4 is an isometric view of a flipping device of the printer of FIG. 1, and a PCB is caught by a first catch of the flipping device.
Figure 5:
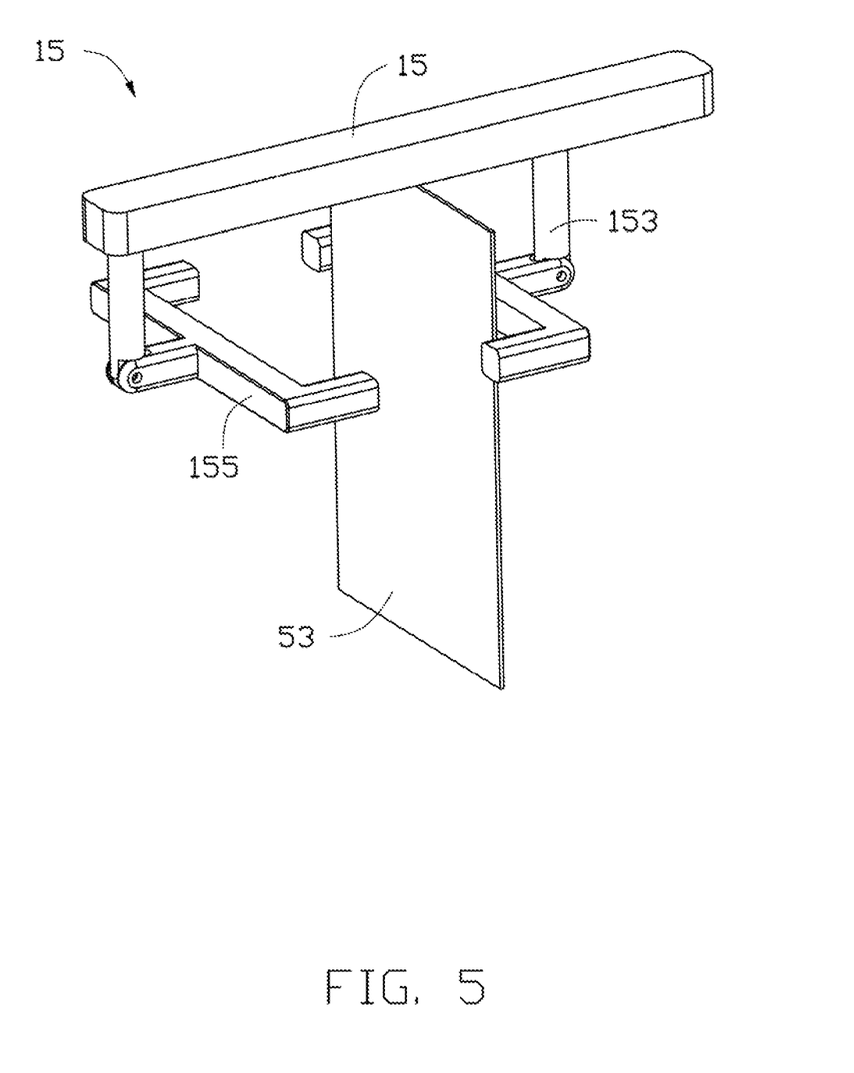
FIG. 5 is similar to FIG. 4, and the PCB is flipped by the first catch.
Figure 6:
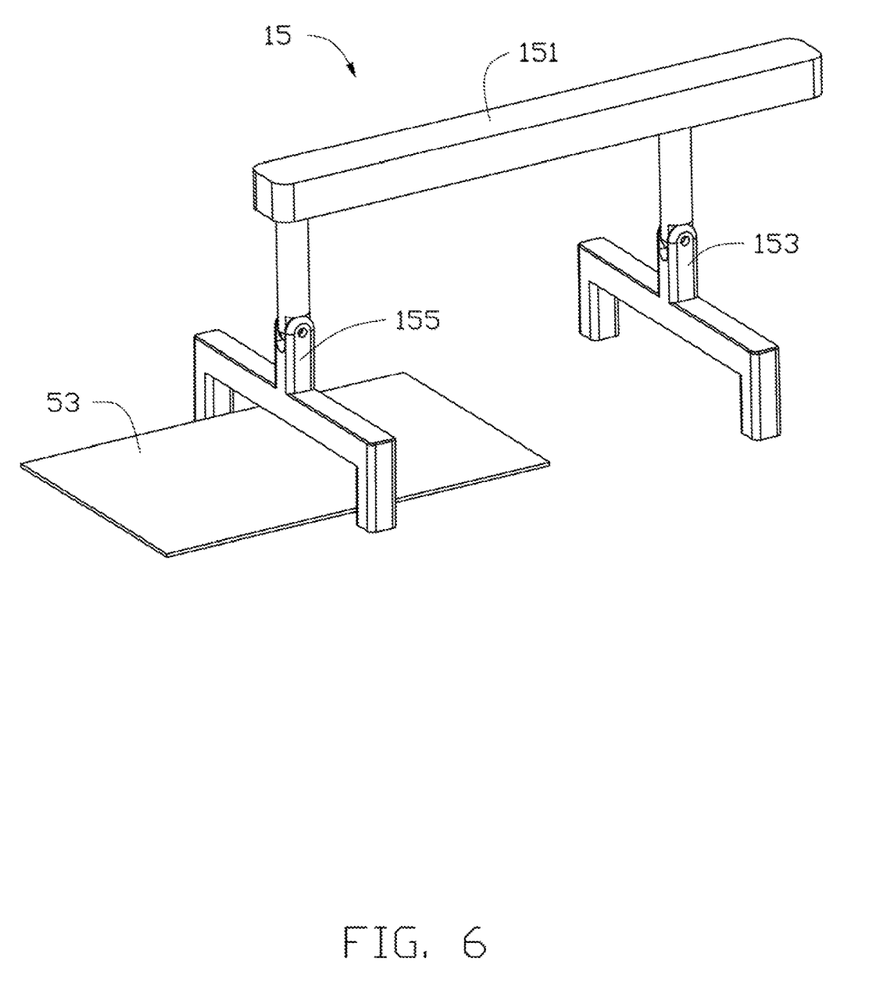
FIG. 6 is similar to FIG. 4, and the PCB is caught by a second catch of the flipping device.

FIGS. 4-6 illustrates the flipping device 15 on the printer 100. The flipping device 15 is configured to flip a bottom layer 53 of PCB 50 above the top layer 51. The flipping device 15 can include a securing pole 151, a first catch 153 coupled to a first end of the securing pole 151, and a second catch 155 coupled to a second end of the securing pole 151. In use, the PCB 50 can be rotated 90 degrees by the first catch 153 to be transported to the second catch 155, when the PCB 50 is caught by the second catch 155, the PBC 50 can be rotated 90 degrees by the second catch 155. Thus, the PCB 50 can be flipped.

The second line printing device 16 is configured to print a line on the bottom layer 53 of the PCB 50. In at least one embodiment, a conductive adhesive or conductive ink can be used in the second line printing device 16.

The second brush 17 is configured to brush insulating adhesive on the bottom layer 53. Thus, the top layer 51 and the bottom layer 53 can be adhered by the insulating adhesive.

Each second belt 20 is configured to transport the PCB 50 to the third belt 30.

In at least one embodiment, the plurality of devices also can include a pressing device 31, a colder mask layer printing device 33, a white text and marking printing device 35, and a solder bump printing device 37. In at least one embodiment, the pressing device 31, the layer printing device 33, the white text and marking printing device 35, and the solder bump printing device 37 are arranged on the third belt 30.

The pressing device 31 is configured to press the top layer 51 to the bottom layer 53.

The layer printing device 33 is configured to print a green solder layer. In at least one embodiment, insulated green oil or insulated black oil can be used in the layer printing device 33.

The white text and marking printing device 35 is configured to print white text and marking on the PCB 50. In at least one embodiment, insulated white oil can be used in the white text and marking printing device 35.

The solder bump printing device 37 is configured to print a solder material (e.g., tin) onto the PCB 50, and electronic components (not shown) can be soldered onto the PCB 50 via the printed solder material. In at least one embodiment, liquid tin is used in the solder bump printing device 37.

An output opening 60 can be located below the solder bump printing device 37. After the PCB 50 is printed by the solder bump printing device 37, the PCB 50 can drop into a receiving device (not shown) via the output opening 60.

Figure 7:
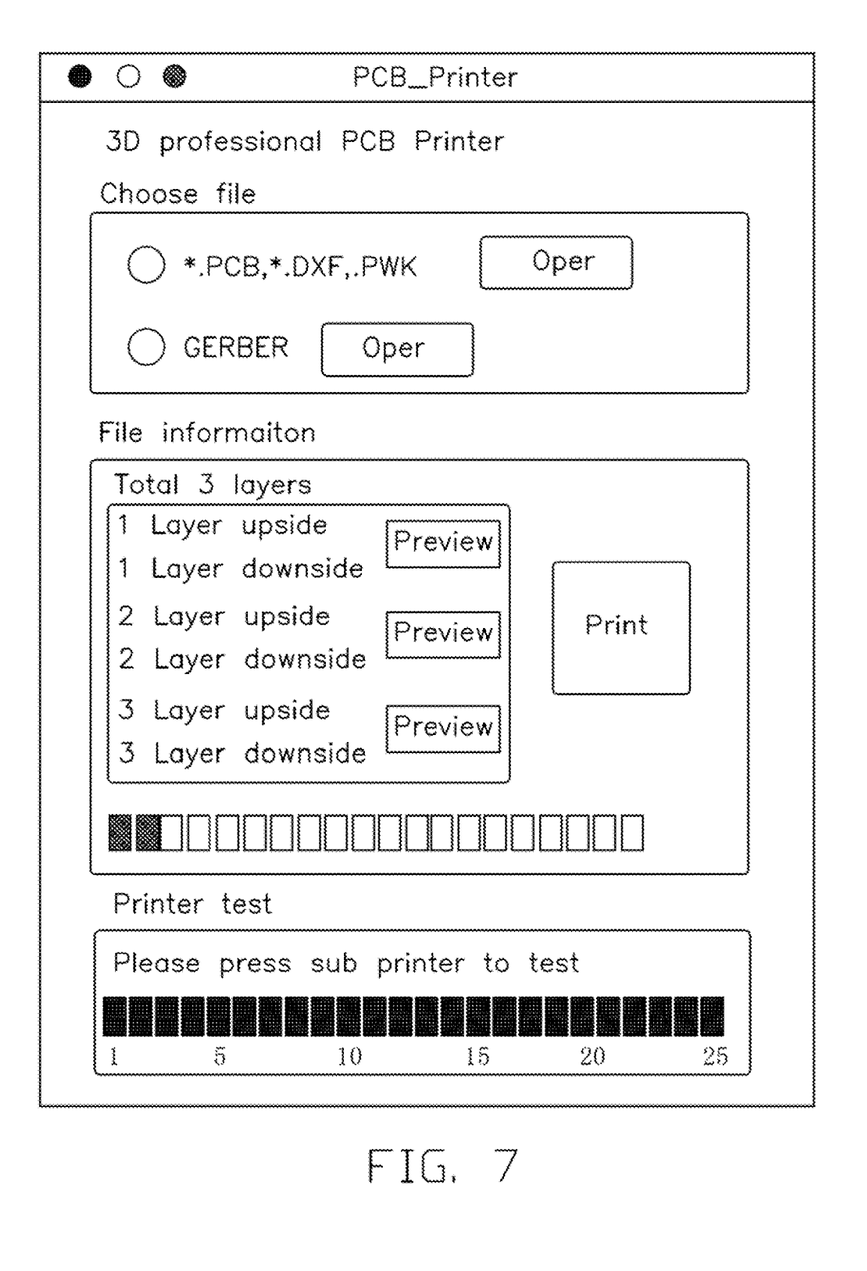
FIG. 7 is a diagrammatic view of a menu user interface used in the printer of FIG. 1.

FIG. 7 illustrates the operation of the printer 100. Driver software can be stored in the printer 100 or an electronic device (not shown) coupled to the printer 100, and a user interface menu can be shown in a display of the printer 100 or the electronic device. In at least one embodiment, the text *.PCB, *.PWK, or *.DXF can be transferred to the text GERBER for distribution to each device by the printer 100. In at least one embodiment, the text, including lines, can be completed by PAD2000, POWERPCB, PROTEL, or CLIENT98, and the printer 100 can distribute the text to each device. For example, the first and second sensors 41, 43 of each tray 40 can be labeled as, SensorA_1, SensorB_1 of first tray 40; SensorA_2, SensorB_2 of second tray 40; SensorA_3, SensorB_3 of third tray 40, and so on. The top layer 51 is punched for distribution of the SensorB_2 (the punching device 12), line for the top layer 51 is distributed to the SensorB_3 (the first line printing device 13), line for the bottom layer 53 is distributed to the SensorB_6 (the second line printing device 16). In at least one embodiment, when the PCB 50 is a multilayer-board, the punching device 12 can be configured to punch a first layer of the PCB 50 and a second layer of the PCB 50.

Figure 8:
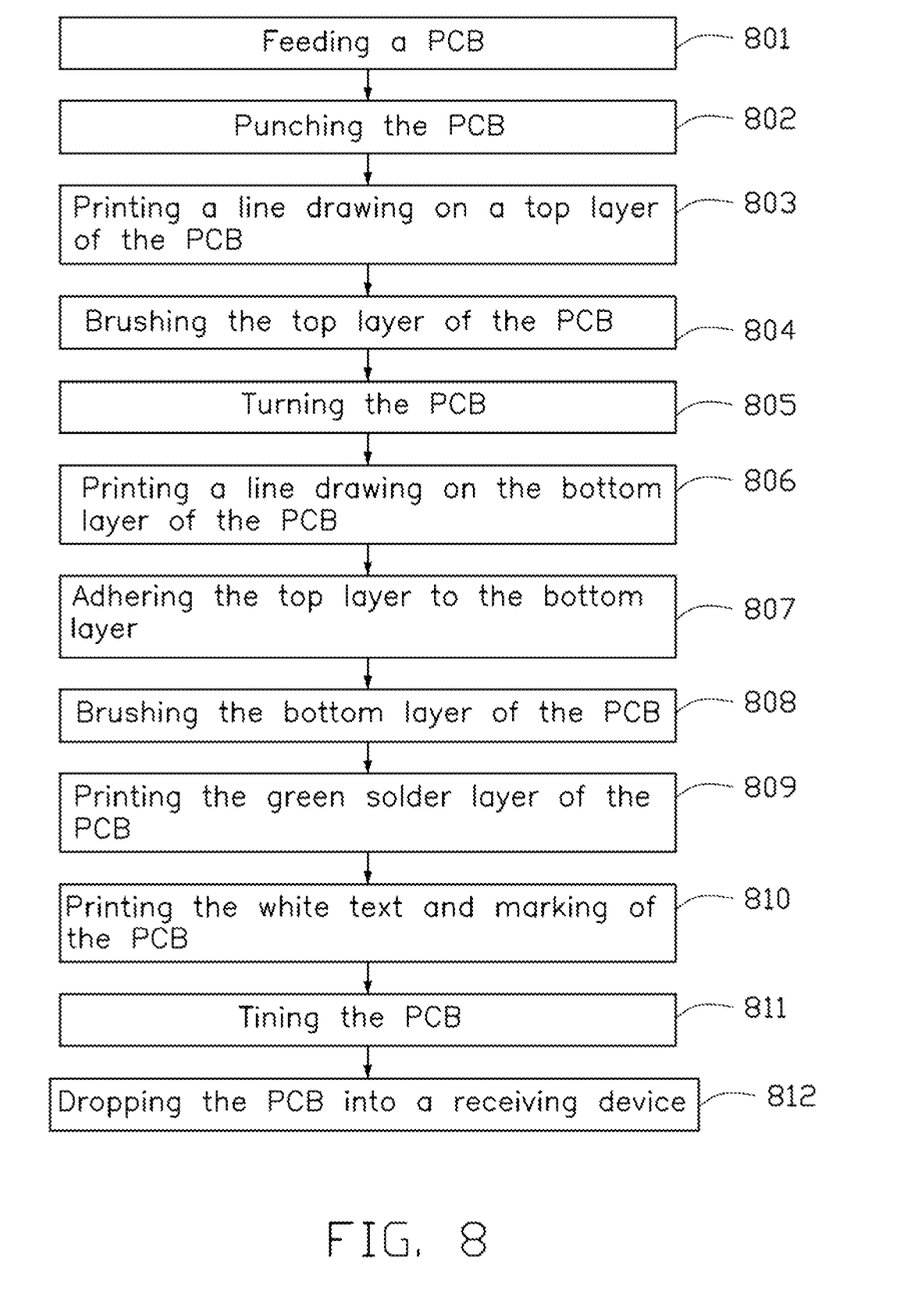
FIG. 8 is a flowchart of printing method for the PCB using the printer of FIG. 1.

Referring to FIG. 8, a flowchart is presented in accordance with an example embodiment which is being thus illustrated. The example method 800 is provided by way of example, as there are a variety of ways to carry out the method. The method 800 described below can be carried out using the configurations illustrated in FIGS. 1-7, for example, and various elements of these figures are referenced in explaining example method 800. Each block shown in FIG. 8 represents one or more processes, methods, or subroutines, carried out in the exemplary method 800. Additionally, the illustrated order of blocks is by example only and the order of the blocks can change. The exemplary method 800 can begin at block 801, using a tray 40 and a PCB 50 as an example.

At block 801, the gears 114 are driven by the driving device to drop the PCB 50 into the tray 40 below the feeding device 11, the first sensor 41 senses that the PCB 50 is in the tray 40 and sends a signal to the first belt 10.

At block 802, the tray 40 is transported by the first belt 10, until the second sensor 43 senses that the tray 40 is located below the punching device 12. The second sensor 43 sends a signal to the driving device for stopping the first belt 10. The punching device 12 punches the PCB 50.

At block 803, the second sensor 43 sends a signal to the driving device to move the first belt 10, until the second sensor 43 senses that the tray 40 is located below the first line printing device 13. The first line printing device 13 prints a line on the top layer 51 of the PCB 50.

At block 804, the second sensor 43 sends a signal to the driving device to move the first belt 10, until the second sensor 43 senses that the tray 40 is located below the first brush 14. The first brush 14 brushes the top layer 51 of the PCB 50 with insulating adhesive.

At block 805, the second sensor 43 sends a signal to the driving device to move the first belt 10, until the second sensor 43 senses that the tray 40 is located below the flipping device 15. The flipping device 15 flips the PCB 50, so that the bottom layer 53 can be above the top layer 51.

At block 806, the second sensor 43 sends a signal to the driving device to move the first belt 10, until the second sensor 43 senses that the tray 40 is located below the second line printing device 16. The second line printing device 16 prints a line on the bottom layer 53 of the PCB 50.

At block 807, the second sensor 43 sends a signal to the driving device to drive the first belt 10, until the second sensor 43 senses that the tray 40 is located below the pressing device 31. The top layer 51 can be adhered to the bottom layer 53 by the pressing device 31.

At block 808, the second sensor 43 sends a signal to the driving device to move the first belt 10, until the second sensor 43 senses that the tray 40 is located below the second brush 17. The second brush 17 brushes the bottom layer 53 of the PCB 50 using insulating adhesive.

At block 809, the second sensor 43 sends a signal to the driving device to move the first belt 10, until the second sensor 43 senses that the tray 40 is located below the layer printing device 33. The layer printing device 33 prints the green solder layer of the PCB 50.

At block 810, the second sensor 43 sends a signal to the driving device to drive the first belt 10, until the second sensor 43 senses that the tray 40 is located below the white text and marking printing device 35. The white text and marking printing device 35 prints the white text and marking on the PCB 50 using insulating adhesive.

At block 811, the second sensor 43 sends a signal to the driving device to drive the first belt 10, until the second sensor 43 senses that the tray 40 is located below the solder bump printing device 37. The solder bump printing device 37 prints a solder bump on the PCB 50 using liquid tin.

At block 812, the PCB 50 drops into the receiving device.

The embodiments shown and described above are only examples. Many details are often found in the art such as the other features of a printer. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A printer comprising:
    a belt;
    a tray arranged on the belt and configured to receive a printed circuit board (PCB) therein;
    a sensor attached to the tray and configured to sense whether the PCB is located in the tray; and
    a plurality of processing devices located along the belt;
    wherein when the PCB is loaded in the tray, the belt is driven by a driving device to transport the tray below toward each of the plurality of processing devices; and
    wherein the plurality of processing devices comprises
        a punching device configured to punch the PCB;
        a first line printing device, arranged downstream of the punching device and configured to print a conductive line pattern on a first side of the PCB;
        a layer printing device, arranged downstream of the line printing device and configure to print a solder layer of the PCB;
        a white text and marking printing device, arranged downstream of the layer printing device and configure to print white text and marking on the PCB; and
        a solder bump printing device, arranged downstream of the white text and marking printing device and configure to print a solder material onto the PCB.

2. The printer of claim 1, wherein the plurality of devices comprises a feeding device, the feeding device comprises a feeding box above the tray and a plurality of gears located on the feeding box, and the plurality of gears are configured to drop the PCB into the tray.

3. The printer of claim 2, wherein the plurality of gears comprises two pairs of gears, a first pair of gears is located on a first side of the feeding box, and a second pair of gears is located on a second opposite side of the feeding box.

4. The printer of claim 1, wherein the PCB is a multilayer board, the plurality of devices further comprises a flipping device, and the flipping device is configured to flip the PCB.

5. The printer of claim 4, wherein the flipping device comprises a securing pole, a first rotatable catch and a second rotatable catch, and the first rotatable catch and the second rotatable catch are coupled to opposite ends of the securing pole.

6. The printer of claim 4, wherein the plurality of devices further comprises a brush, and the brush is configured to brush adhesive on the PCB.

7. The printer of claim 1, wherein the PCB is a multilayer board, the plurality of devices comprises a flipping device and a pressing device, the flipping device is configured to flip the PCB, and the pressing device is configured to press the PCB.

8. The printer of claim 4, further comprises a second line printing device arranged downstream of the flipping device and configured to print a conductive line pattern on a second side of the PCB.

9. The printer of claim 1, wherein the line printing device is configured to print conductive line pattern on the PCB using at least one of conductive adhesive or conductive ink.

10. The printer of claim 9, wherein the line printing device is configured to adjust a thickness of printed conductive line pattern according to a viscosity of the conductive adhesive or ink.

11. The printer of claim 9, wherein the conductive ink has particles with diameters less than 0.1 micron.

\* \* \* \* \*